(12) United States Patent
Liu et al.

(10) Patent No.: US 6,797,528 B2
(45) Date of Patent: Sep. 28, 2004

(54) MICRO PROBING TIP MADE BY MICRO MACHINE METHOD

(75) Inventors: Mingo Liu, Hsin-chu (TW); Jeng-Han Lee, King-Chen (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 168 days.

(21) Appl. No.: 10/053,224

(22) Filed: Jan. 17, 2002

(65) Prior Publication Data

US 2003/0134441 A1 Jul. 17, 2003

(51) Int. Cl.⁷ ......................... G01R 31/26; H01L 21/66
(52) U.S. Cl. ............................ 438/14; 438/18; 438/52; 438/83; 438/100; 438/101
(58) Field of Search .............................. 438/14, 18, 52, 438/83, 100, 101; 324/754

(56) References Cited

U.S. PATENT DOCUMENTS 6,458,206 B1 * 10/2002 Givargizov et al. ......... 117/101

OTHER PUBLICATIONS

Stanley Wolf (Silicon Processing for the VLSI Era, vol. 1) (pp. 238–239, 335, and 371–373).*

* cited by examiner

Primary Examiner—W. David Coleman
Assistant Examiner—Khiem D Nguyen
(74) Attorney, Agent, or Firm—Tung & Associates

(57) ABSTRACT

A method and apparatus for forming a micro tip for a micro probe utilized in testing semiconductor integrated circuit devices. A thick oxide layer is deposited upon a substrate initially to form the micro tip. The micro tip for the micro probe can be defined from the thick oxide layer upon the substrate through a plurality of subsequent semiconductor manufacturing operations performed upon the substrate and layers thereof. A plurality of micro tips can be mass produced and efficiently utilized in association with increasingly smaller sizes of semiconductor integrated circuit devices.

13 Claims, 2 Drawing Sheets

MICRO PROBING TIP MADE BY MICRO MACHINE METHOD

TECHNICAL FIELD

The present invention relates generally to semiconductor fabrication methods and systems. The present invention relates to probe assemblies of the type commonly used for testing integrated circuits (IC)

BACKGROUND OF THE INVENTION

As semiconductor integrated circuits continue to be dramatically reduced in size, the trend in electronic manufacturing has been toward increasingly smaller geometries particularly in integrated circuit technology in which a very large number of discrete circuit elements are fabricated on a single substrate or "wafer." After fabrication, this wafer is divided into a number of rectangular-shaped chips or "dice" where each die presents a rectangular or other regular arrangement of metallized contact pads through which input/output connections are made. Although each die is eventually packaged separately, for efficiency sake, testing of the circuit formed on each die is preferably performed while the dies are still joined together on the wafer. One typical procedure is to support the wafer on a flat stage or "chuck" and to move the wafer in X, Y and Z directions relative to the head of the probing assembly so that the contacts on the probing assembly move from die to die for consecutive engagement with each die. Respective signal, power and ground lines are run to the probing assembly from the test instrumentation thus enabling each circuit to be sequentially connected to the test instrumentation.

One conventional type of probing assembly used for testing integrated circuits provides contacts that are configured as needle-like tips. These tips are mounted about a central opening formed in a probe card so as to radially converge inwardly and downwardly through the opening. When the wafer is raised beyond that point where the pads on the wafer first come into contact with these tips, the tips flex upwardly so as to skate forwardly across their respective pads thereby removing oxide buildup on the pads.

The problem with this type of probing assembly is that the needle-like tips, due to their narrow geometry, exhibit high inductance so that signal distortion is large in high frequency measurements made through these tips. Also, these tips can act in the manner of a planing tool as they wipe across their respective pads, thereby leading to excessive pad damage. This problem is magnified to the extent that the probe tips bend out of shape during use or otherwise fail to terminate in a common plane which causes the more forward ones of the tips to bear down too heavily on their respective pads.

Thus, in the course of testing semiconductor devices and circuits it becomes necessary to contact and electrically probe the devices and circuits to ascertain their function and determine failure mechanisms. To accomplish this, a finely pointed probe tip or group of finely pointed probe tips is brought into contact with the device or circuit by using pads connected to the device or circuit. As semiconductor devices become smaller and circuits denser, it becomes difficult to make electrical contact with the device with conventional probes, as the probe tips are either too large or too blunt to selectively contact only the intended device or circuit because they have a propensity to contact adjacent structures. Or, the tips are so thin as to bend when contact is attempted and slide off the probe terminal target circuit being tested. When multiple probes are required, it is often not possible to bring the correct number of probe tips close enough to each other because the size of the bodies will physically interfere with one another or will block the view of the target area being tested, thereby making alignment difficult or impossible.

As a result of these problems, pads on semiconductor devices which can number several hundred are often limited by the probe assemblies or probe rings used because of the size of the probe tips. This is especially true in the street or kerf regions between active dies on semiconductor wafers, wherein special test and process monitoring devices and circuits are often fabricated. The actual devices and monitoring structures are often very much smaller than the pads connected to them. A more compact probe assembly would allow smaller pads to be used allowing more devices in the same space or the same number of devices in a smaller space.

The present inventors thus recognize based on the foregoing, that a need exists for an acceptable micro tip that can be utilized with micro probes as semiconductor circuits continue to shrink. Users typically waste a great deal of time and effort attempting to fabricate an acceptable micro tip. To date, a reliable method for fabricating an acceptable micro tip has not been evidenced. The present inventors believe that implementing a micro tip in accordance with the invention described herein can thus solve these problems.

BRIEF SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

It is therefore one aspect of the present to provide an improved semiconductor manufacturing method and device thereof.

It is another aspect of the present invention to provide a method for forming a micro tip of a micro probe.

It is still another aspect of the present invention to provide a method for forming a micro tip of a micro probe utilizing micromachine manufacturing techniques.

It is yet another aspect of the present invention to provide a micro tip formed upon a substrate from an oxide layer configured below a conductive metal.

It is also an aspect of the present invention to provide a micro tip for a micro probe that can be efficiently mass produced and utilized with increasingly smaller sizes of integrated circuit devices.

The above and other aspects of the present invention can thus be achieved as is now described. A method and apparatus are disclosed herein for forming a micro tip for a micro probe utilized in testing semiconductor integrated circuit devices. A thick oxide layer is deposited upon a substrate initially to form the micro tip. The micro tip for the micro probe can be defined from the thick oxide layer upon the substrate through a plurality of subsequent semiconductor manufacturing operations performed upon the substrate and layers thereof. A plurality of micro tips can be mass produced and efficiently utilized in association with increasingly smaller sizes of semiconductor integrated circuit devices. The micro tip may be adapted for use with a micromachine. The micro tip may also be connected to a micro machine. The micro probe, in association with the micro tip, may comprise a micromachine. The micro tip of the micro probe may be defined utilizing a plurality of micromachine manufacturing operations.

The micro tip may be formed according to a plurality of semiconductor manufacturing operations. Thus, a first lithography operation may be performed upon the substrate and layers thereof following a deposition of the thick oxide layer upon the substrate. A first metal sputter operation may then be performed upon the substrate and layers thereof, following the first lithography operation. Thereafter, a chemical mechanical polishing (CMP) operation may be performed upon the substrate and the layers thereof. Next, a second metal sputter operation may be performed upon the substrate and layers thereof. Thereafter, a second lithographic operation can be performed upon the substrate and the layers, in order to define a shape of the micro tip. The micro tip itself may be formed between a conductive metal layer and the substrate. The conductive metal layer can comprise an aluminum layer. The substrate may comprise a silicon substrate.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

DETAILED DESCRIPTION OF THE INVENTION

The particular values and configurations discussed in these non-limiting examples can be varied and are cited merely to illustrate embodiments of the present invention and are not intended to limit the scope of the invention.

Figure 1:
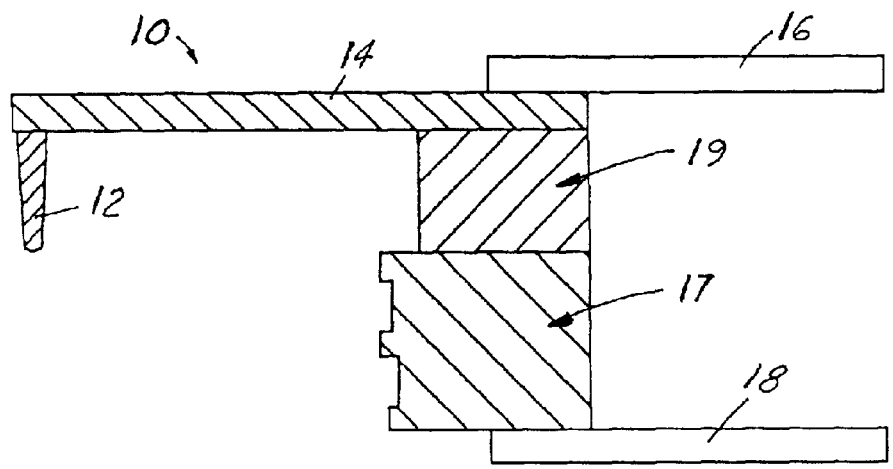
FIG. 1 illustrates a cross-sectional view of a micro probe and micro tip, which may be implemented in accordance with a preferred embodiment of the present invention.

FIG. 1 illustrates a cross-sectional view of a micro probe 10 and micro tip 12, which may be implemented in accordance with a preferred embodiment of the present invention. Microprobe 10 includes a region 16 situated above a conductive metal region 14. Conductive metal region 14 is situated above a layer 19, which in turn is situated above a layer 17. Layer 17 is configured above a region 18. Layer 17 may be formed from a substrate. Micro tip 12 is connected to conductive metal region 14.

Figure 2:
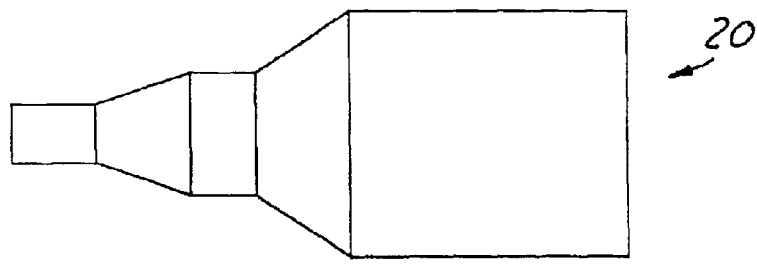
FIGS. 2 and 3 depict a top view and a cross-sectional view of a micro probe and micro tip, which may be implemented in accordance with an alternative embodiment of the present invention.
Figure 3:
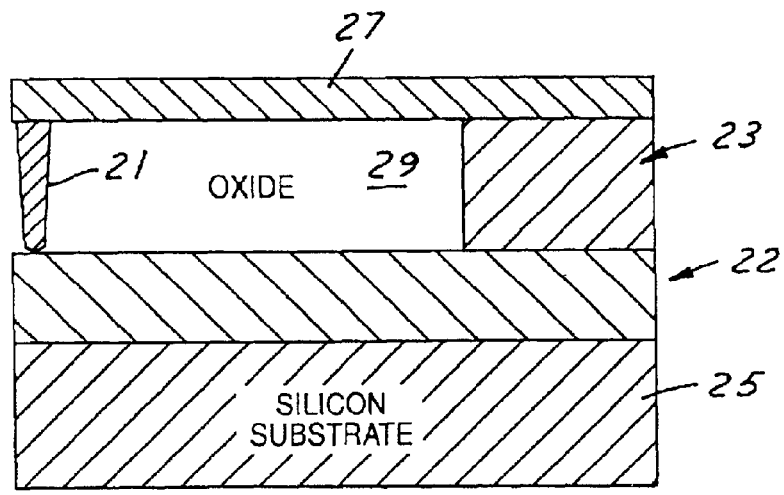

FIGS. 2 and 3 depict a top view 20 and a cross-sectional view 22 of a micro probe and micro tip 21, which may be implemented in accordance with an alternative embodiment of the present invention. Micro tip 21 is generally connected to a conductive metal 27. Conductive metal 27 may comprise any conductive metal, such as, for example, aluminum. An additional layer 22 may be configured above substrate 25. Substrate 25 may comprise a silicon substrate. An oxide region 29 is configured above substrate 25 and layer 22. Layer 22 and substrate 25 may alternatively form a single substrate layer above which an oxide region 29 may be formed. Substrate 25 can, for example, have parameters of approximately 20 um×25 um. Oxide region 29 may be deposited above substrate 25 (which may include layer 22 as a single substrate). Micro tip 21 can thus be defined from oxide region 29 and located above substrate 25 and layer 22, but below conductive metal 27.

Figure 4:
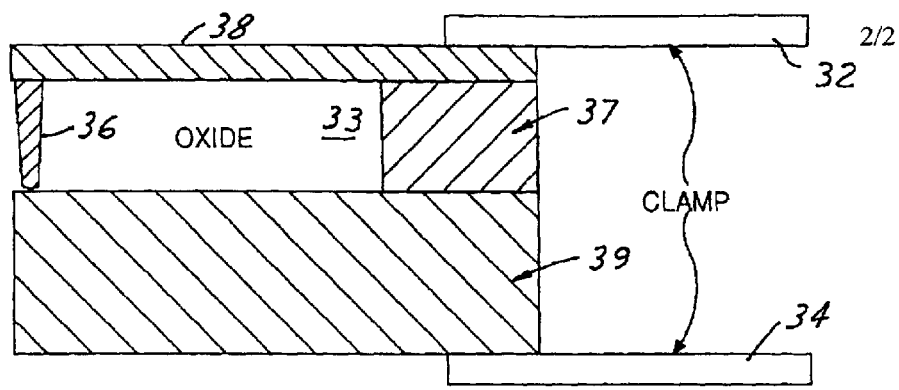
FIG. 4 illustrates a cross-sectional view of a micro probe and micro tip, including a clamp structure thereof, in accordance with an alternative embodiment of the present invention.

FIG. 4 illustrates a cross-sectional view of a micro probe 30 and a micro tip 36, including a clamp structure thereof, in accordance with an alternative embodiment of the present invention. The clam structure may be formed from clamp region 32 and clamp region 24. Micro tip 36 of FIG. 4 is generally analogous to micro tip 21 of FIG. 3. An oxide region 33 can be deposited above substrate 39. Substrate 39 may comprise a silicon substrate. Substrate 39 of FIG. 4 is thus analogous to substrate 25 of FIG. 3. Note, as indicated above, substrate 25 and layer 22 of FIG. 3 may comprise a single substrate. A layer 37 can be formed above substrate 39, along with oxide region 33. Micro tip 36 is generally defined from oxide region 33 below conductive metal 33. Note that conductive metal 33 may comprise a conductive metal, such as, for example, aluminum. Clamps 32 and 24 may be positioned to provide support to micro probe 30 and micro tip 36.

Figure 5:
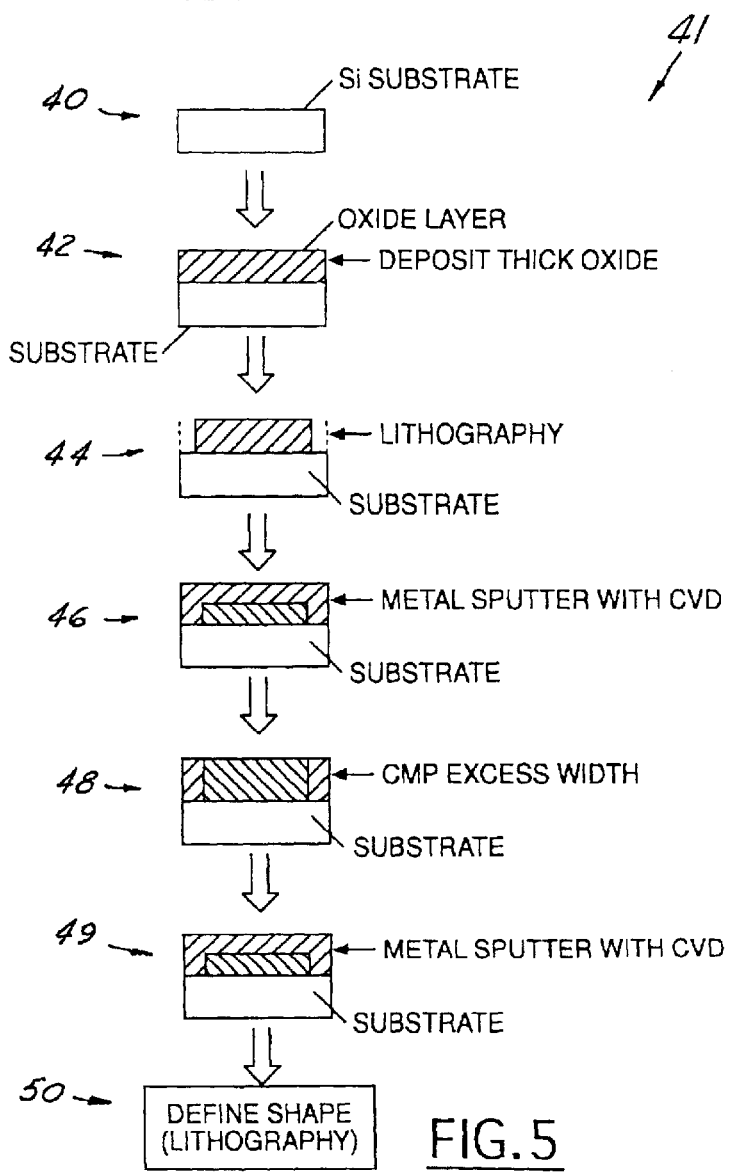
FIG. 5 depicts a block diagram illustrating semiconductor manufacturing operations that may be implemented to configure a micro tip of a micro probe, in accordance with preferred and alternative embodiments of the present invention.

FIG. 5 depicts a block diagram 41 illustrating semiconductor manufacturing operations that may be implemented to configure a micro tip of a micro probe, in accordance with preferred and alternative embodiments of the present invention. Initially, as indicated at operational step 40, a silicon substrate may be utilized to begin a process for fabricating a micro tip, such as, for example, micro tip 36 of FIG. 4. Thereafter, as depicted at operational step 42, an oxide layer can be deposited above the silicon substrate. As indicated next at operational step 44, a first lithography step or operation may be performed above the substrate and layers thereof. As illustrated thereafter at operational step 46, a first metal sputter operation with CVD may be performed upon the substrate and layers thereof. Next, as depicted at operational step 48, a chemical mechanical polishing (CMP) operation may be performed upon the substrate and layers thereof. Then, as illustrated at operational step 49, a second metal sputter operation with CVD may be performed upon the substrate and layers thereof. Finally, as indicated at block 50, a second lithography step or operation may be performed upon the substrate and layers thereof to define the shape of a micro tip, such as micro tip 36 of FIG. 4.

Based on the foregoing it can thus be appreciated that the present invention disclosed herein generally describes a method and apparatus for forming a micro tip for a micro probe utilized in testing semiconductor integrated circuit devices. A thick oxide layer is generally deposited upon a substrate initially to form the micro tip. The micro tip for the micro probe can be defined from the thick oxide layer upon the substrate through a plurality of subsequent semiconductor manufacturing operations performed upon the substrate and layers thereof. A plurality of micro tips can be mass-produced and efficiently utilized in association with increasingly smaller sizes of semiconductor integrated circuit devices. The micro tip may be adapted for use with a micromachine. The micro tip may also be connected to a micro machine. The micro probe, in association with the micro tip, may comprise a micromachine. The micro tip of the micro probe may be defined utilizing a plurality of micromachine manufacturing operations.

The micro tip may be formed according to a plurality of semiconductor manufacturing operations. Thus, a first lithography operation may be performed upon the substrate and layers thereof following a deposition of the thick oxide layer upon the substrate. A first metal sputter operation may then be performed upon the substrate and layers thereof, following the first lithography operation. Thereafter, a chemical mechanical polishing (CMP) operation may be performed upon the substrate and the layers thereof. Next, a second metal sputter operation may be performed upon the substrate and layers thereof. Thereafter, a second lithographic operation can be performed upon the substrate and the layers, in order to define a shape of the micro tip. The micro tip itself may be formed between a conductive metal layer and the substrate. The conductive metal layer can comprise an aluminum layer. The substrate may comprise a silicon substrate.

It can also be appreciated, based on the foregoing, that a micro tip fabricated according to the present invention can be utilized efficiently with micromachined micro probes required for increasingly smaller circuits. As semiconductor devices become smaller and circuits denser, it generally becomes difficult to make electrical contact with the device with conventional probes, as the probe tips are either too large or too blunt to selectively contact only the intended device or circuit because they have a propensity to contact adjacent structures. The micro tip of the present invention is ideally suited to make electrical contact with increasingly smaller integrated circuit devices, unlike conventional probes. A micro machine method can thus be employed, according to the present invention, to produce a micro tip. Such a micro tip can be combined successfully with a micro machine for efficient connectivity.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is thus not intended to be exhaustive or to limit the scope of the invention. Many modifications and variations are possible in light of the above teaching without departing from scope of the following claims. It is contemplated that the use of the present invention can involve components having different characteristics. It is intended that the scope of the present invention be defined by the claims appended hereto, giving full cognizance to equivalents in all respects.

What is claimed is:

1. A method for forming a micro tip for a micro probe utilized in testing semiconductor integrated circuit devices, said method comprising the steps of:
    depositing a thick oxide layer upon a substrate, wherein a thickness of said thick oxide layer is thick with respect to a thickness of said substrate; and
    performing a first lithography operation upon said substrate and layers thereof following a deposition of said thick oxide layer upon said substrate;
    performing a first metal sputter operation upon said substrate, following said first lithography operation performed upon said substrate and said layers thereof;
    performing a chemical mechanical polishing operation upon said substrate and said layers thereof following said first metal sputter operation performed upon said substrate;
    performing a second metal sputter operation upon said substrate, following said chemical mechanical polishing operation performed upon said substrate and said layers thereof; and
    defining a micro tip for a microprobe from said thick oxide layer upon said substrate through a plurality of subsequent semiconductor manufacturing operations performed upon said substrate and layers thereof, wherein a plurality of said micro tips are mass produceable and can be efficiently utilized in association with increasingly smaller sizes of semiconductor integrated circuit devices.

2. The method of claim 1 further comprising the step of: adapting said micro tip of said microprobe for use with a micromachine.

3. The method of claim 1 further comprising the step of: connecting said micro tip of said microprobe to a micromachine.

4. The method of claim 1 further comprising the step of: defining said micro tip of said microprobe utilizing a plurality of micromachine manufacturing operations.

5. The method of claim 1 further comprising the step of: performing a second lithographic operation upon said substrate and said layers thereof following said second metal sputter operation performed upon said substrate, in order to define a shape of said micro tip.

6. The method of claim 1 further comprising the step of: forming said micro tip for said micro probe on a substrate, wherein said micro tip is formed between a conductive metal layer and said substrate.

7. The method of claim 6 wherein said conductive metal layer comprises an aluminum layer.

8. The method of claim 1 wherein said substrate comprise a silicon substrate.

9. The method of claim 1 wherein the step of depositing a thick oxide layer upon a substrate, further comprises the step of:
    depositing said thick oxide layer upon said substrate, wherein said thickness of said thick oxide layer comprises a thickness thereof in a range from approximately equal to at least half of said thickness of said substrate to said thickness of said substrate.

10. A method for forming a micro tip for a micro probe utilized in testing semiconductor integrated circuit devices, said method comprising the steps of:
    depositing a thick oxide layer upon a substrate;
    defining a micro tip for a microprobe from said thick oxide layer upon said substrate through a plurality of subsequent semiconductor manufacturing operations performed upon said substrate and layers thereof;
    performing a first lithography operation upon said substrate and layers thereof following a deposition of said thick oxide layer upon said substrate;
    performing a first metal sputter operation upon said substrate, following said first lithography operation performed upon said substrate and said layers thereof;
    performing a chemical mechanical polishing operation upon said substrate and said layers thereof following said first metal sputter operation performed upon said substrate;
    performing a second metal sputter operation upon said substrate, following said chemical mechanical polishing operation performed upon said substrate and said layers thereof; and performing a second lithographic operation upon said substrate and said layers thereof following said second metal sputter operation performed upon said substrate, in order to define a shape of said micro tip, wherein a plurality of said micro tips are mass produceable and can be efficiently utilized in association with increasingly smaller sizes of semiconductor integrated circuit devices.

11. The method of claim 10 further comprising the step of: forming said micro tip for said micro probe on said substrate, wherein said micro tip is formed between a conductive metal layer and said substrate.

12. The method of claim 11 wherein said conductive metal layer comprises an aluminum layer.

13. The method of claim 10 wherein said substrate comprises a silicon substrate.

* * * * *